(12) United States Patent
Chou et al.

(10) Patent No.: US 7,518,145 B2
(45) Date of Patent: Apr. 14, 2009

(54) INTEGRATED MULTIPLE GATE DIELECTRIC COMPOSITION AND THICKNESS SEMICONDUCTOR CHIP AND METHOD OF MANUFACTURING THE SAME

(75) Inventors: Anthony I. Chou, Beacon, NY (US); Renee T. Mo, Briarcliff Manor, NY (US); Shreesh Narasimha, Beacon, NY (US)

(73) Assignee: International Business Machines Corporation, Armonk, NY (US)

( * ) Notice: Subject to any disclaimer, the term of this patent is extended or adjusted under 35 U.S.C. 154(b) by 98 days.

(21) Appl. No.: 11/627,001

(22) Filed: Jan. 25, 2007

(65) Prior Publication Data

US 2008/0179714 A1 Jul. 31, 2008

(51) Int. Cl.
*H01L 29/10* (2006.01)
(52) U.S. Cl. .......................... 257/66; 438/149
(58) Field of Classification Search ............... 257/66; 438/800, 900, 149
See application file for complete search history.

(56) References Cited

U.S. PATENT DOCUMENTS

| 6,706,581 | B1 | 3/2004 | Hou et al. |
| 6,787,421 | B2 | 9/2004 | Gilmer et al. |
| 6,890,811 | B2 | 5/2005 | Hou et al. |
| 2002/0142624 | A1* | 10/2002 | Levy et al. .................. 438/786 |

* cited by examiner

*Primary Examiner*—Jerome Jackson, Jr.
*Assistant Examiner*—Jami M Valentine
(74) *Attorney, Agent, or Firm*—Rosa S. Yaghmour; Greenblum & Bernstein P.L.C.

(57) ABSTRACT

A method comprises forming a material over a substrate and patterning the material to remove portions of the material and expose an underlying portion of the substrate. The method further includes performing an oxidation process to form an oxide layer over the exposed portion of the substrate and at an interface between the material and the substrate. A circuit comprises a non-critical device and an oxide formed as part of this non-critical device. A high-K dielectric material is formed over a substrate as part of the critical device within the circuit. An oxide based interface is provided between the high-K dielectric material and an underlying substrate. A second method forms a nitride or oxynitride as the first material.

1 Claim, 9 Drawing Sheets interface quality improved by oxidation interface quality improved by oxidation interface quality improved by oxidation thin oxide surface is protected from HF and resist

INTEGRATED MULTIPLE GATE DIELECTRIC COMPOSITION AND THICKNESS SEMICONDUCTOR CHIP AND METHOD OF MANUFACTURING THE SAME

FIELD OF THE INVENTION

The invention relates to a semiconductor chip and method of manufacturing the same, and more particularly to an integrated multiple gate oxide thickness or composition semiconductor chip and method of manufacturing the same.

BACKGROUND DESCRIPTION

Within CMOS technologies, there is a need to create Field-Effect Transistors (FETs) with multiple gate dielectrics within a chip. By way of example, multiple gate dielectric thicknesses are required for different device performance and product requirements. Thin dielectrics are often required for high performance logic, whereas, thicker dielectrics are required to support I/O circuitry that operates at higher voltages. It is also desirable to create areas within a semiconductor chip containing distinct gate dielectric composition. The different gate dielectric compositions can include oxides, nitrides, oxynitrides, high-K dielectrics, or stacked combinations of these films. These dielectrics possess different properties, including leakage, capacitance, mobility, interface quality, reliability, charge trapping, and diffusion barrier characteristics. By placing different dielectrics in areas of the circuit that can benefit from the specific properties of that dielectric, the overall performance of the semiconductor chip can be optimized.

Beyond the previously mentioned FET application of multiple gate dielectric formation, additional thickness or composition gate dielectrics may be required for capacitor applications such as decoupling capacitors or DRAM storage capacitors, to optimize the requirements for gate leakage and capacitance per unit area.

However, there are limitations with current integration schemes. For example, a standard integration sequence is to grow the thicker (first) dielectric over the entire wafer, then using a lithographic mask, wet etching areas in which the thin (second) dielectric is to be grown. In this integration scheme, the substrate surface within areas where the thin (second) dielectric is to be formed is always subjected to a resist strip process which grows a chemical oxide. This chemical oxide is incorporated into the thinner second oxide and can compromise the dielectric quality. Using this type of integration sequence also results in exposing the thin (second) dielectric area to an additional wet etch process, which can degrade the interface quality by inducing surface roughening. These degradation mechanisms in the thin dielectric area are particularly problematic because the thinner dielectric is generally the critical area of the semiconductor chip that requires the highest quality. Similar disadvantages exist with standard integration schemes that create multiple dielectric composition areas within a chip.

Accordingly, there exists a need in the art to overcome the deficiencies and limitations described hereinabove.

SUMMARY OF THE INVENTION

In a first aspect of the invention, a method comprises forming a dielectric material over a substrate and patterning the material to remove portions of the material and expose an underlying portion of the substrate. The method further includes performing an oxidation process to form an oxide layer over the exposed portion of the substrate and at an interface between the material and the substrate.

In another aspect of the invention, a method comprises forming a high-K dielectric material over a substrate and patterning the high-K dielectric material to expose a non-critical portion of the substrate. The method further includes performing a low temperature oxidation process to form an oxide layer over the exposed portion of the substrate and at an interface between the high-K dielectric material and the substrate.

In yet another aspect of the invention, a circuit comprises a non-critical device formed with an oxide gate dielectric, and a critical device with a high-K dielectric material and an oxide based interface between the high-K dielectric material and an underlying substrate.

DETAILED DESCRIPTION OF EMBODIMENTS OF THE INVENTION

The invention relates to a semiconductor chip and method of manufacturing the same, and more particularly to an integrated multiple gate dielectric composition and thickness semiconductor chip and method of manufacturing the same. In embodiments, the semiconductor chip of the invention is manufactured using integration sequences which enable the creation of, for example, oxide/oxynitride and high-K gate dielectrics within the same semiconductor chip. The integration of materials improves the high-K dielectric interface by growing an interfacial layer underneath the high-K dielectric and avoiding exposure of the high-K dielectric to high temperatures which can degrade the high-K properties.

By way of example, the integration comprises $SiO_2$ (oxide) or SiON (oxynitride) gate dielectrics in areas of the chip which require high performance transistors, and can tolerate high gate leakage/power dissipation. Also, high-K gate dielectrics (e.g., $HfO_2$, HfSiO, HfSiON, $ZrO_2$, etc.) are contemplated for use in areas of the chip which require low gate leakage/power dissipation transistors. Another integration contemplated by the invention is the use of $SiO_2$ or SiON gate dielectrics for high performance transistors and high-K gate dielectrics for decoupling capacitor arrays (high capacitance per unit area) or for SRAM arrays. Another integration contemplated by the invention is the use of thicker $SiO_2$ or SiON gate dielectric for the low gate leakage transistors, and high-K gate dielectric for the lower Tinv and higher performance portions of the array and or logic.

In the first aspect of the invention, a method comprises forming a high-K dielectric material over a substrate and patterning the high-K dielectric material to expose a non-critical portion of the substrate. The method further includes performing an oxidation process, either low temperature plasma, thermal, or radical, to form an oxide layer over the exposed portion of the substrate and at an interface between the high-K dielectric material and the substrate. This aspect may alternately include thermal plasma nitridation prior to the oxidation or after the oxidation.

In the second aspect of the invention, a method comprises forming a nitride or oxynitride dielectric layer by either plasma or thermal nitridation on a substrate and patterning the nitride layer to expose a non-critical portion of the substrate. The method further includes performing an oxidation process, either low temperature plasma, thermal, or radical, to form an oxide layer over the exposed portion of the substrate and at an interface between the nitride dielectric material and the substrate. This aspect may alternately include additional nitridation by either plasma or thermal nitridation after the oxidation.

Figure 1:
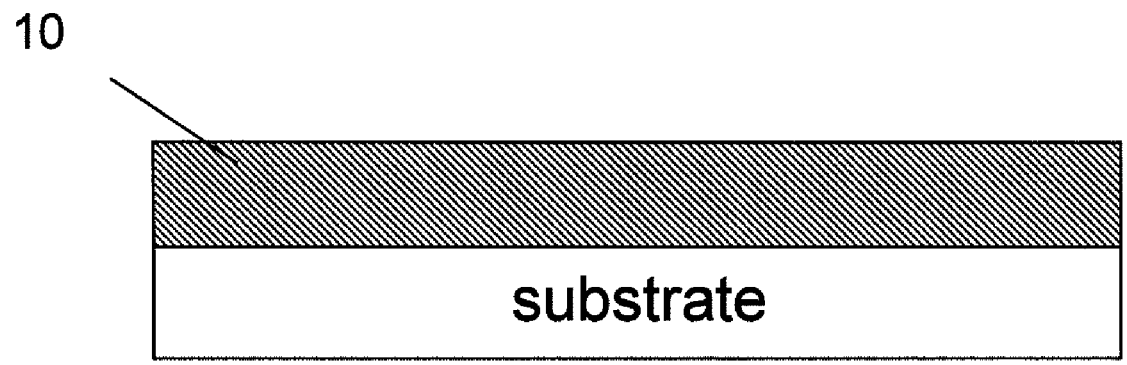
FIGS. 1-4 show processing steps and a final structure in accordance with a first aspect of the invention.

FIG. 1 shows a beginning structure in accordance with one aspect of the invention. In this beginning structure, a high-K dielectric material 10 is deposited over a substrate. Prior to the deposition of the high-K dielectric material 10, the substrate can be precleaned with the use of, for example, HF and/or SC1 and SC2, to maintain a thin stack.

For illustrative purposes, the substrate is only shown in FIG. 1; however, it should be recognized by those of skill in the art that all of the structures shown herein include a substrate. The substrate is preferably silicon but may be made of gallium arsenide, silicon-germanium, or silicon-on-insulator (SOI) substrates. Furthermore, the substrate may contain dopants that are either n-type or p-type dopants.

The high-K dielectric material 10 may be, for example, $HfO_2$, HfSiOx, HfSiON, $ZrO_2$, or a combination thereof. In embodiments, the high-K dielectric material 10 can range from about 10 Å to 40 Å, although other thicknesses are contemplated by the invention, depending on specific required device performance. In embodiments, the high-K dielectric material 10 has a value greater than $SiO_2$ and more preferably a K value of greater than 10. The high-K dielectric material 10 may be deposited using, for example, commonly known techniques such as CVD, PVD, and atomic layer deposition.

Figure 2:
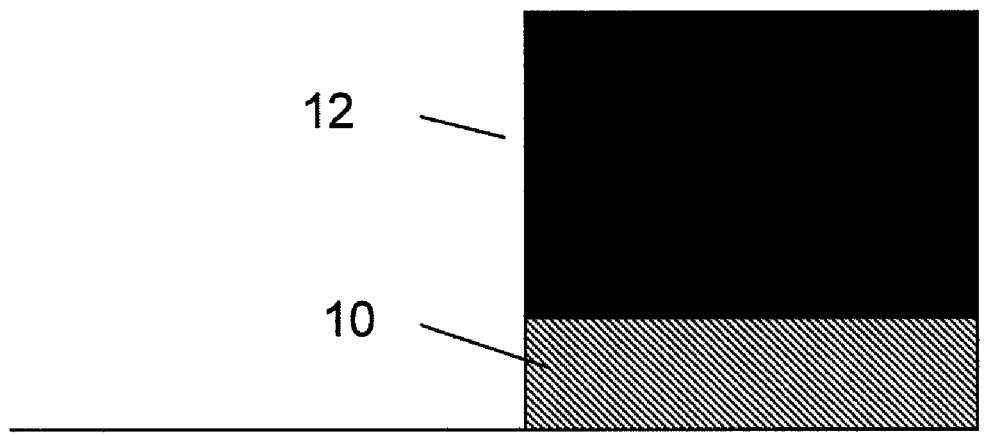

FIG. 2 shows a lithography process in accordance with the invention. In this implementation, a resist layer 12 is deposited over a portion of the high-K dielectric material 10. In this implementation, the resist layer 12 is formed over the critical side of the chip. i.e., the high performance side of the chip. The resulting structure is then subject to conventional lithographic processes to remove the photoresist from the non-critical side devices. The unprotected high-K dielectric material 10 is removed from the non-critical devices. In implementation, a MOSFET which is a low power device will be fabricated on the non-critical area and a MOSFET which is a high performance device will be fabricated on the critical area.

Figure 3:
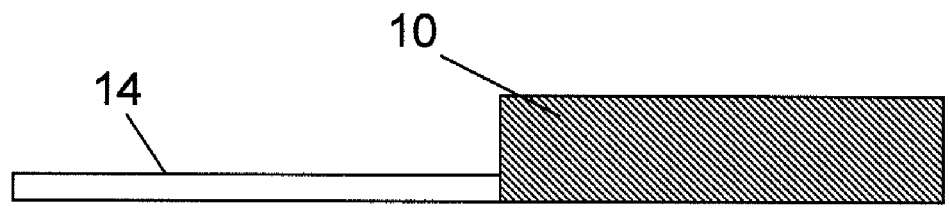

FIG. 3 shows another process step in accordance with the invention. In this processing step, the resist layer 12 over the critical area is stripped using conventional stripping processes. For example, the resist layer 12 can be stripped using a sulfuric acid and hydrogen peroxide solution. The stripping process forms a thin oxide 14 on the non-critical area (e.g., lower performance devices). As should be understood, the thin oxide material 14 is an artifact of the stripping process. The resulting thin oxide material 14 may be about 12 Å in thickness. The process of stripping will shift any potential damage away from the critical area to the non-critical area (due to the protective high-K dielectric layer 10).

Figure 4:
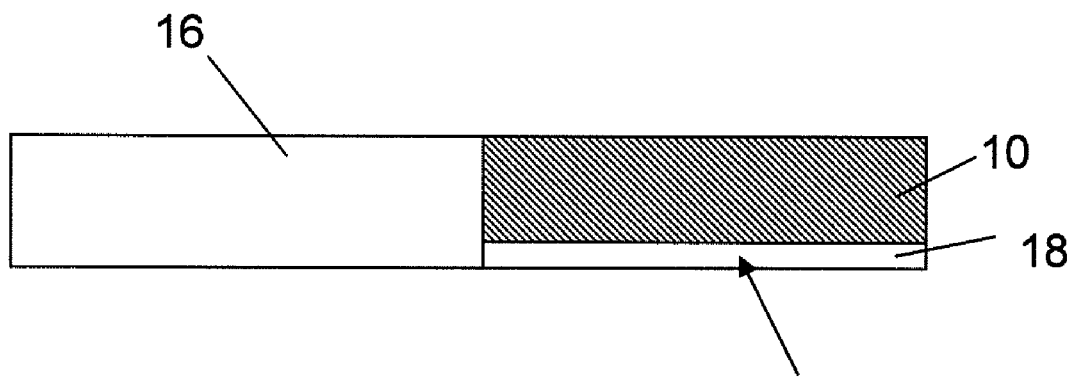

FIG. 4 represents further processing steps in accordance with the invention. In these processing steps, the structure of FIG. 4 is precleaned. In embodiments, the precleaning may be SC1 and SC2 cleaning.

An oxidation is performed to form an oxide layer 16 on the non-critical area. In this processing step, a thin oxide 18 is formed under the high-K dielectric material 10. In one embodiment, the oxide layer 16 is about 20 Å and the thin oxide layer 18 is about 3 Å. In embodiments, the high-K dielectric material 10 will slow down the oxidation process thus resulting in the thinner oxide layer 18. The thin oxide layer 18 provides an interface between the substrate and the high-K dielectric material 10, which provides improvement over direct contact between the high-K dielectric material 10 and the substrate.

The oxidation may be a plasma, radical, or thermal oxidation process. In a preferred embodiment, the oxidation is performed at a low temperature (e.g., less than or equal to 400° C.) to avoid the degradation of the high-K dielectric material 10. In further processing steps, a MOSFET can be built on the high-K material in known formation processes.

Figure 5:
FIGS. 5-9 show processing steps and a final structure in accordance with a first aspect of the invention with the optional plasma nitridation after the oxidation.

FIG. 5 shows a beginning structure in accordance with an aspect of the invention with an optional plasma nitridation after oxidation. As in FIG. 1, in this beginning structure, a high-K dielectric material 10 is deposited over a substrate. Prior to the deposition step, the substrate can be precleaned with the use of, for example, HF and/or SC1 and SC2, to maintain a thin stack. In embodiments, the high-K dielectric material 10 can range from about 10 Å to 40 Å, although other thicknesses are also contemplated by the invention, depending on specific required device performance. In embodiments, the high-K dielectric material 10 has a value greater than $SiO_2$ and more preferably a K value of greater than 10. The high-K dielectric material 10 may be $HfO_2$, HfSiOx, HfSiON, $ZrO_2$, or other dielectric material. The high-K dielectric material 10 may be deposited using, for example, CVD, PVD, ALD, etc.

Figure 6:
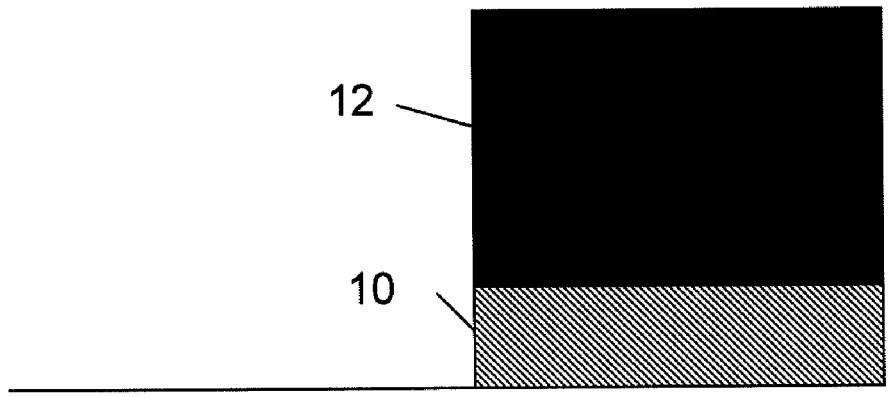

FIG. 6 shows a lithography process in accordance with the invention. In this implementation, as in FIG. 2, a resist layer 12 is deposited over a portion of the high-K dielectric material 10. The resist layer 12 is formed over the critical area. i.e., the high performance devices. The resulting structure is then subject to conventional lithography and etch processes such that the unprotected high-K dielectric material 10 is removed from the non-critical areas.

Figure 7:
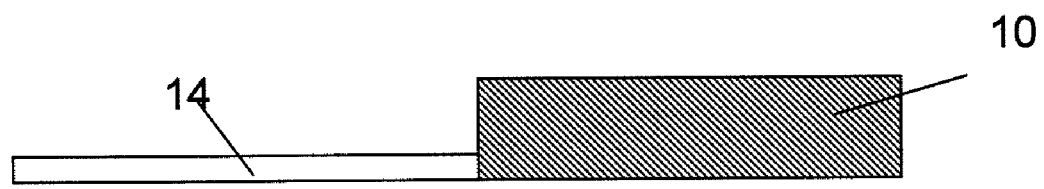

FIG. 7 shows another process step in accordance with the invention. In this processing step, the resist layer 12 over the critical side of the chip is stripped using conventional stripping processes, as discussed with reference to FIG. 3. The resulting thin oxide material 14 may be about 12 Å in thickness. The process of stripping will shift any potential damage caused from the stripping process from the critical devices to the non-critical devices (due to the protective properties of the high-K dielectric material 10).

Figure 8:
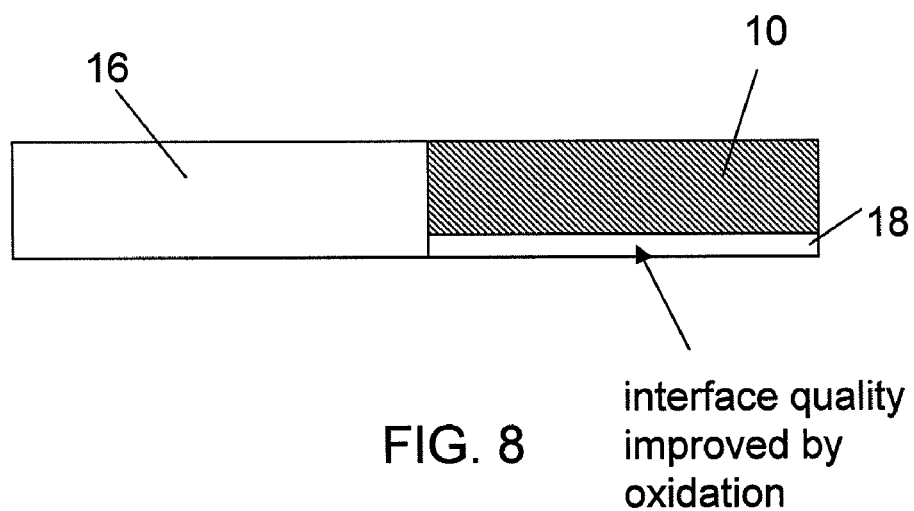

FIG. 8 represents further processing steps in accordance with the invention. In these processing steps, the structure is precleaned using, for example, SC1 and SC2. An oxidation is performed to form an oxide layer 16 on the non-critical areas. In this processing step, as with FIG. 4, a thin oxide layer 18 is formed under the high-K dielectric material 10. In one embodiment, the oxide layer 16 is about 20 Å and the thin oxide layer 18 is about 3 Å. As in the previous embodiment, the high-K dielectric material 10 will slow down the oxidation process thus resulting in the thinner oxide layer 18 at the interface between the substrate and the high-K dielectric material 10.

As in the previous embodiment, the oxidation may be a plasma, radical or thermal oxidation process. In a preferred embodiment, the oxidation is performed at a low temperature (e.g., less than or equal to 400° C.) to avoid the degradation of the high-K material 10. In further processing steps, a MOSFET can be built on the high-K dielectric material in known formation processes.

Figure 9:
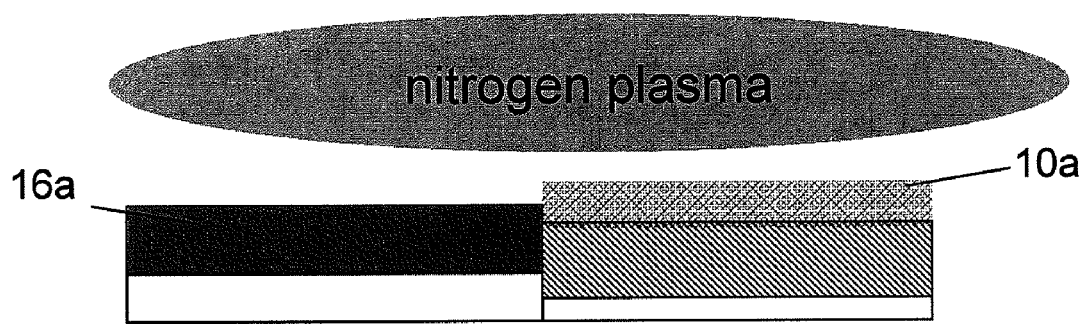

In FIG. 9, a plasma nitridation process is performed at a low temperature. For example, the plasma nitridation process can be performed at about 400° C. or less. By performing a plasma nitridation over the entire structure, it is possible to form a dielectric with reduced gate leakage with respect to a non-nitridized dielectric, thus resulting in reduced power consumption. Additionally, the plasma nitridation provides an improved diffusion barrier for dopants, e.g., boron, thus preventing boron from penetrating into the underlying substrate. That is, the nitridation improves the general properties of the high-K dielectric material 10 (forming a nitridized high-K material 10a) and also the oxide 16 by optimizing its barrier capabilities.

Figure 10:
FIGS. 10-14 show processing steps and a final structure in accordance with a first aspect of the invention with the optional plasma nitridation prior to the oxidation.

FIGS. 10-14 are substantially the same as those described with reference to FIGS. 5-9. However, in this embodiment, the nitridation process is performed prior to the oxidation step of the previous embodiments. By way of example, FIG. 10 shows a beginning structure. Similar to FIG. 1 and FIG. 5, a high-K dielectric material 10 is deposited over a substrate after a precleaning process.

Figure 11:
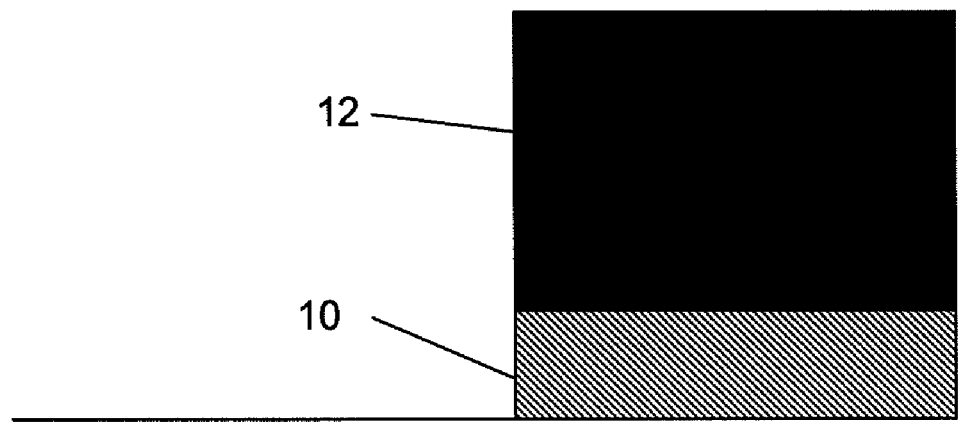
Figure 12:
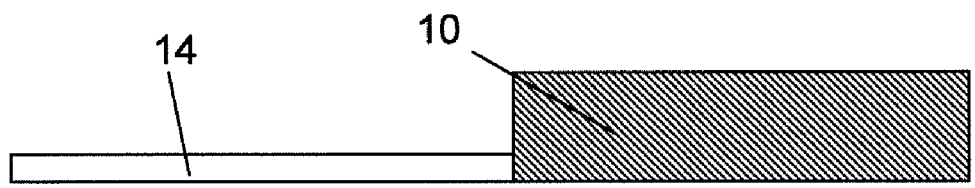

In FIG. 11, a resist is deposited over the high-K dielectric material 10. Lithography and etch processes are then performed which remove the high-K dielectric material 10 from the non-critical areas. In FIG. 12, the resist layer 12 over the critical side area is stripped using conventional stripping processes, as discussed with reference to FIG. 3. The resulting thin oxide material 14 may be about 12 Å in thickness. The process of stripping will shift any potential damage caused from the stripping process from the critical side areas to the non-critical areas (due to the protective properties of the high-K dielectric material 10).

Figure 13:
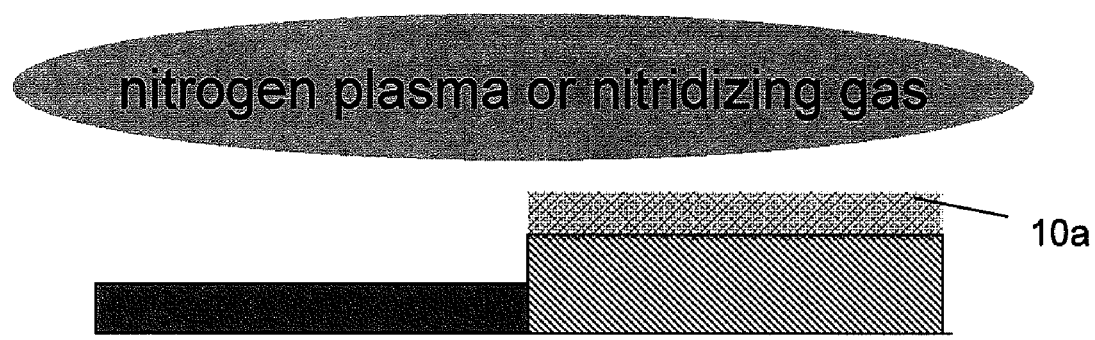

In FIG. 13, a precleaning step is performed, as discussed above. A plasma nitridation is also performed at a low temperature to form a nitridized high-K dielectric material 10a. For example, the plasma nitridation can be performed at about 400° C. or less. By performing a plasma nitridation over the entire structure, it is possible to reduce leakage current in the oxide material which will be subsequently formed on the non-critical side of the chip. The plasma nitridation, at this processing stage, will provide a different nitrogen profile in the subsequently formed oxide layer.

As previously discussed, the plasma nitridation provides a good diffusion barrier for dopants, e.g., boron, thus preventing boron from penetrating into the underlying substrate, as well as improves the general properties of the high-K dielectric material 10 by optimizing its barrier and leakage capabilities. In embodiments, the processing conditions are dependent on the desired device qualities.

Figure 14:
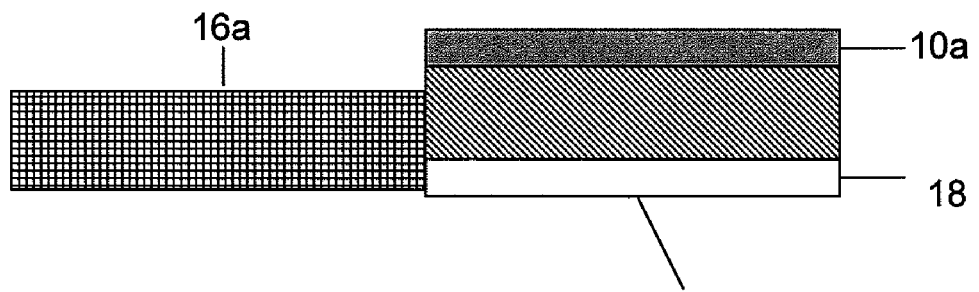
Figure 15:
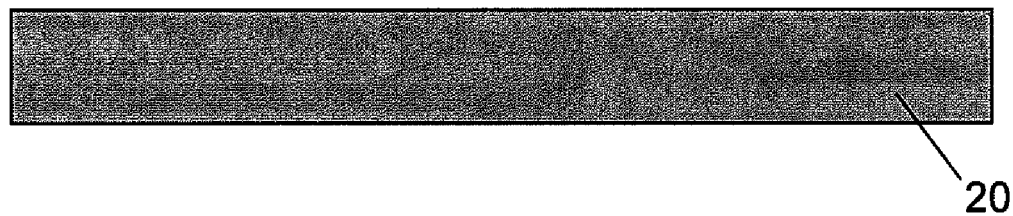
FIGS. 15-19 show processing steps and a final structure in accordance with a second aspect of the invention.

FIG. 14 represents an oxidation step to form an oxynitride layer 16a on the non-critical devices. In this processing step, as with FIG. 4 and FIG. 8, a thin oxide is formed under the high-K dielectric material 10. In one embodiment, the oxide forms the oxynitride layer 16a to about 10-20 Å. The high-K dielectric material 10 will slow down the oxidation process thus resulting in a thin oxide interface 18 between the substrate and the high-K material dielectric 10, as discussed above. As in the previous embodiments, the oxidation may be a plasma, radical or thermal oxidation process. In a preferred embodiment, the oxidation is preferably performed at a low temperature (e.g., less than or equal to 400° C.) to avoid the degradation of the high-K material dielectric 10. In further processing steps, a gate can be built on the high-K material in known formation processes.

FIGS. 15-19 show another embodiment in accordance with an aspect of the invention. In this embodiment, a precleaning process is performed similar to that described above. In addition, a direct nitridation is performed to form a nitride layer 20. The step shown in FIG. 15 may be performed by plasma or thermal processes.

Figure 16:
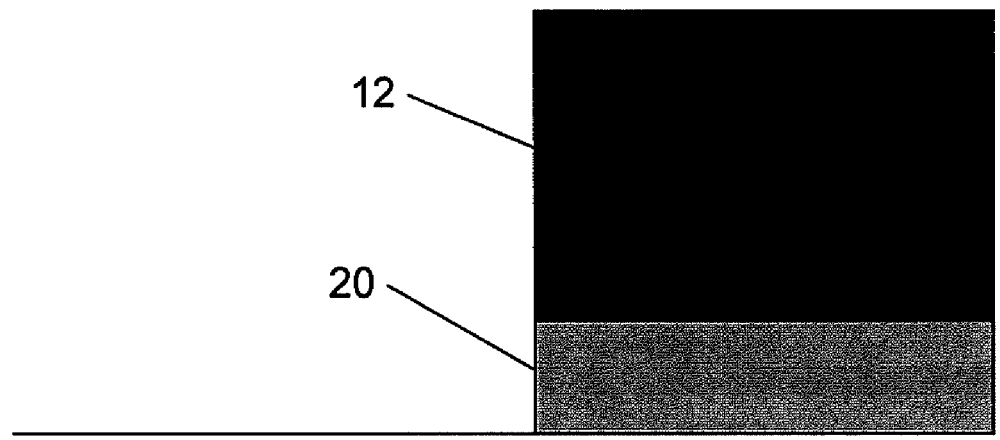

FIG. 16 shows a lithography process in accordance with the invention. In this embodiment, a resist layer 12 is deposited over a portion of the nitride layer 20. The resist layer 12 is formed over the critical areas. i.e., the high performance devices. The resulting structure is then subject to conventional etch processes such that the nitride layer 20 is removed on the non-critical side of the chip.

Figure 17:
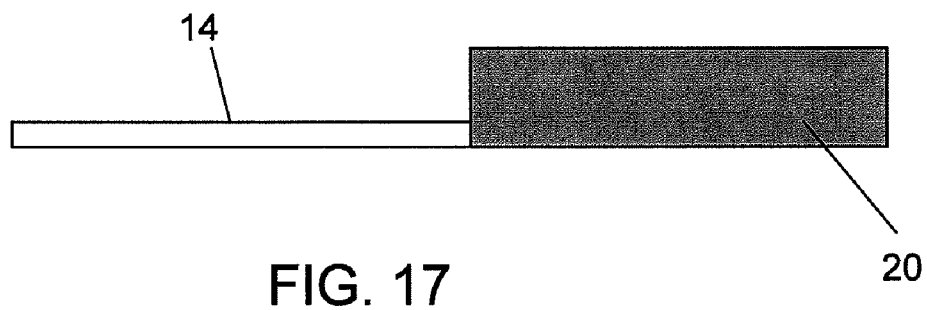

In FIG. 17, the resist layer 12 over the critical side of the chip is stripped using conventional stripping processes, as discussed with reference to FIG. 3. The stripping process forms a resulting thin oxide material 14 of about 12 Å. The process of stripping will shift any potential damage caused from the stripping process from the critical areas to the non-critical areas (due to the protective properties of the nitride layer 20).

Figure 18:
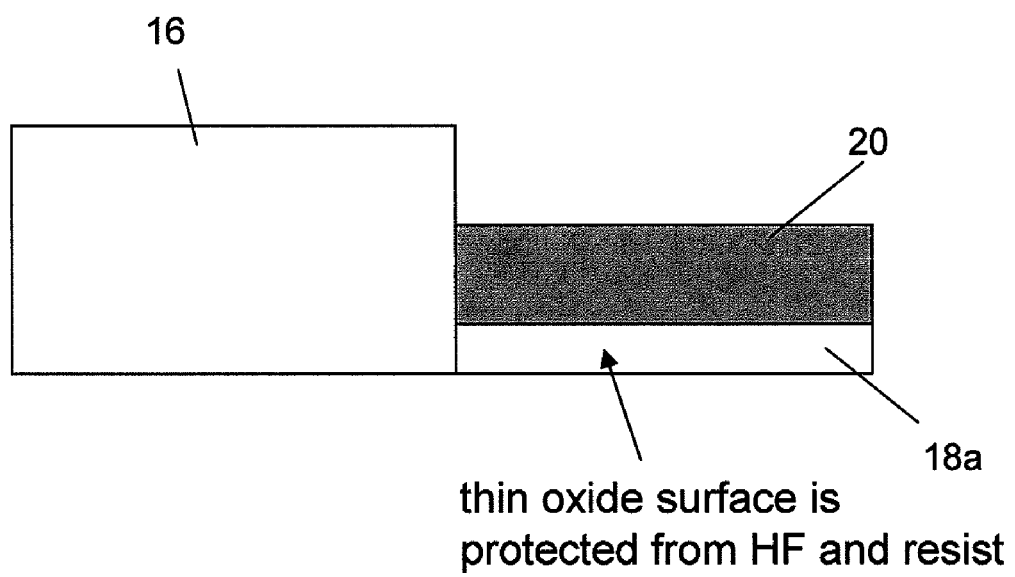

FIG. 18 represents further processing steps in accordance with the invention. In these processing steps, the structure is precleaned using, for example, SC1 and SC2. An oxidation is performed to form a thick oxide layer 16 on the non-critical areas. In this processing step, a thin oxide or oxynitride layer 18a is formed under the nitride layer 20. Similar to the high-K dielectric embodiments, the nitride layer 20 will slow down the oxidation process thus resulting in a thinner oxide (oxynitride) layer 18a, providing an interface between the substrate and nitride layer 20. This interface provides improvement from the interface between the nitride layer 20 and the substrate. As in the previous embodiments, the oxidation may be a plasma, radical or thermal oxidation process.

Figure 19:
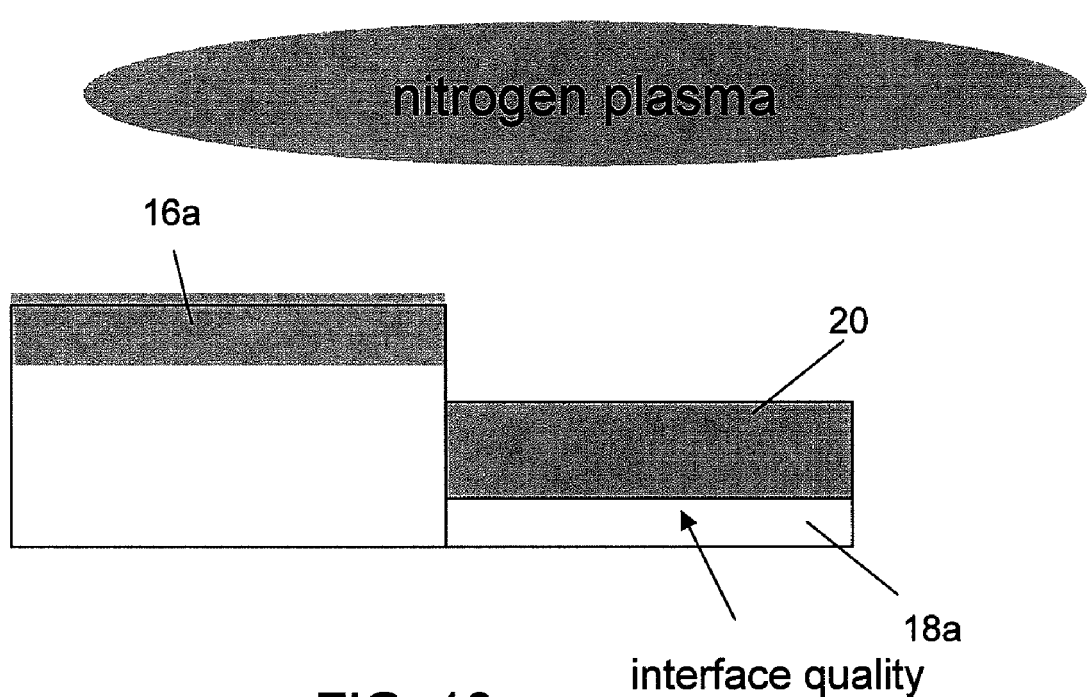

In FIG. 19, an optional plasma nitridation process is performed at a low temperature. For example, the plasma nitridation process can be performed at about 400° C. or less. By performing a plasma nitridation over the entire structure, it is possible to reduce leakage current in the oxide material thus saving power in the chip and reducing the potential for dopant diffusion into the substrate.

As thus should be now understood, multiple gate dielectric composition, i.e., different composition and thickness gate dielectrics, are fabricated within a single chip to support various devices. For example, in embodiments, different nitrogen concentrations and profiles are contemplated for various devices to appropriately balance benefits of oxynitrides (gate leakage reduction, $T_{inv}$ reduction). The invention contemplates the use of differential oxidation rates for different dielectric layers or surface treatments to generate multiple dielectrics. For example, nitrogen in gate dielectrics can reduce oxidation rate. One embodiment uses such properties to generate multiple gate dielectric thickness by creating areas with different nitrogen concentration, followed by oxidation. The area with higher nitrogen concentration will have a reduced oxidation rate and will result in thinner dielectric, while the area with a lower nitrogen content will grow at a higher rate resulting in a thicker dielectric. This avoids exposure of the thin oxide Si surface to photoresist, and also eliminates one HF exposure and potential increase in surface roughness on the thin oxide area, compared to the current integration scheme. These are beneficial because they maintain a higher quality Si surface/interface in the thin dielectric area which is the most critical product area. Similar embodiments and benefits are achieved by integrating multiple gate dielectric materials such as high-K dielectrics and oxides within the same chip, as described above.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

While the invention has been described in terms of exemplary embodiments, those skilled in the art will recognize that the invention can be practiced with modifications and in the spirit and scope of the appended claims.

The invention claimed is:

1. A method, comprising:

forming a material over a substrate;

patterning the material to remove portions of the material and expose an underlying portion of the substrate;

performing an oxidation process thereby forming an oxide layer over the exposed portion of the substrate and at an interface between the material and the substrate; and precleaning the substrate prior to the forming of the material, performing a nitridation process after the oxidation process thereby forming a nitrogen based layer at a top of the material and the oxide layer, the nitridation is performed at a low temperature, wherein the material is a high-K dielectric material of HfSiOx or $HfO_2$, the patterning includes depositing a resist layer over a portion of the high-K dielectric on a critical area and removing unprotected high-K material on a non-critical area such that damage caused from stripping is only to the non-critical area, the oxidation is performed at a low temperature of about 400° C. or less, the high-K dielectric material blocks the oxidation process resulting in the interface between the substrate and the high-K dielectric material, and the nitridation process reduces leakage current in the oxide and provides a diffusion barrier for dopants thus preventing boron from penetrating into the substrate.

* * * * *